United States Patent
Shimoda et al.

(10) Patent No.: US 10,421,172 B2
(45) Date of Patent: Sep. 24, 2019

(54) PROCESSING DEVICE

(71) Applicant: TOKYO SEIMITSU CO., LTD, Tokyo (JP)

(72) Inventors: Makoto Shimoda, Tokyo (JP); Masaki Kanazawa, Tokyo (JP)

(73) Assignee: Tokyo Seimitsu Co. LTD., Tokyo (JP)

(*) Notice: Subject to any disclaimer, the term of this patent is extended or adjusted under 35 U.S.C. 154(b) by 0 days.

(21) Appl. No.: 15/777,833

(22) PCT Filed: Nov. 28, 2016

(86) PCT No.: PCT/JP2016/085119
§ 371 (c)(1),
(2) Date: May 21, 2018

(87) PCT Pub. No.: WO2017/094646
PCT Pub. Date: Jun. 8, 2017

(65) Prior Publication Data
US 2018/0345439 A1    Dec. 6, 2018

(30) Foreign Application Priority Data
Dec. 1, 2015   (JP) .................. 2015-235201

(51) Int. Cl.
*B24B 37/04*   (2012.01)
*B24B 7/04*   (2006.01)
(Continued)

(52) U.S. Cl.
CPC ............... *B24B 7/228* (2013.01); *B24B 7/04* (2013.01); *B24B 7/22* (2013.01); *B24B 27/0046* (2013.01);
(Continued)

(58) Field of Classification Search
CPC .. B24B 7/04; B24B 7/22; B24B 7/228; B24B 27/0046; B24B 37/04; B24B 37/30;
(Continued)

(56) References Cited

U.S. PATENT DOCUMENTS 5,718,619 A * 2/1998 Merrill ...................... B24B 7/16
451/247
6,343,980 B1 * 2/2002 Abe .......................... B24B 7/04
451/292
(Continued)

FOREIGN PATENT DOCUMENTS

EP   0328034 A2 * 8/1989 ............ B24B 41/02
JP   H11245147   9/1999
(Continued)

OTHER PUBLICATIONS

International Search Report, PCT/JP2016/085119, dated Feb. 14, 2017, 2 pages.

*Primary Examiner* — Eileen P Morgan
(74) *Attorney, Agent, or Firm* — Fattibene and Fattibene LLC; Paul A. Fattibene

(57) ABSTRACT

[Problem] To provide a processing device for grinding by suppressing brittle-mode grinding and stabilizing a wafer. [Solution] A processing device 1 is provided with: an index table 2 on which a wafer W is moved from a coarse grinding stage S2 to a fine grinding stage S3; a column 4 provided so as to span over the coarse grinding stage S2 and the fine grinding stage S3; a coarse grinding means 5 provided on the column 4 above the coarse grinding stage S2, the coarse grinding means 5 performing coarse-grinding processing on the wafer W; and a fine grinding means 6 provided on the column 4 over the fine grinding stage S3, the fine grinding means 6 performing fine-grinding processing on the wafer W.

8 Claims, 10 Drawing Sheets

(51) Int. Cl.
 *B24B 7/22* (2006.01)
 *B24B 41/02* (2006.01)
 *B24B 41/047* (2006.01)
 *B24B 27/00* (2006.01)
 *B24B 37/30* (2012.01)
 *B24B 47/14* (2006.01)
 *H01L 21/67* (2006.01)
 *H01L 21/02* (2006.01)

(52) U.S. Cl.
 CPC .............. *B24B 37/04* (2013.01); *B24B 37/30* (2013.01); *B24B 41/02* (2013.01); *B24B 41/047* (2013.01); *B24B 47/14* (2013.01); *H01L 21/67092* (2013.01); *H01L 21/02013* (2013.01)

(58) Field of Classification Search
 CPC ....... B24B 41/02; B24B 41/04; B24B 41/047; H01L 21/02013; H01L 21/67092
 USPC .................................................. 451/65, 285
 See application file for complete search history.

(56) References Cited

U.S. PATENT DOCUMENTS

| | | | |
|---|---|---|---|
| 8,506,358 B2 * | 8/2013 | Amarell | B23F 23/04 409/9 |
| 10,173,296 B2 * | 1/2019 | Kanazawa | B24B 47/14 |
| 2018/0215006 A1 * | 8/2018 | Kanazawa | B24B 27/0023 |

FOREIGN PATENT DOCUMENTS

| | | |
|---|---|---|
| JP | H11309664 | 11/1999 |
| JP | 2003-007661 | 1/2003 |
| JP | 2010172999 | 8/2010 |
| JP | 2015199158 | 11/2015 |

* cited by examiner

PROCESSING DEVICE

TECHNICAL FIELD

The present invention relates to a processing device performing coarse-grinding processing and fine-grinding processing on a wafer and, more particular, to a processing device continuously performing coarse grinding and fine grinding without damaging a wafer.

BACKGROUND ART

In the field of semiconductor manufacturing, rear-surface grinding which grinds the rear surface of a wafer is performed to form a semiconductor wafer (to be referred to as a "wafer" hereinafter) such as a silicon wafer into a thin film.

As a processing device performing rear-surface grinding to a wafer, as described in Patent Literature 1, a planarizing device in which a cassette containing stage, an alignment stage, a coarse-grinding stage, a fine-grinding stage, a polishing stage, a polishing cloth cleaning stage, a polishing cloth dressing stage, and a wafer cleaning stage are set to cause an index table to move a wafer between the stages is known. In such a planarizing device, two grinding stones cantilevered from the distal ends of a grinding stone feeding device arranged outside the index table are disposed, respectively, one of the grinding stones coarsely grinds the wafer, and the other finely grinds the wafer.

The processing device, as shown in FIG. 9A, includes a column 91, a spindle 93 cantilevered from the column 91 through a ball screw 92, a grinding stone 94 attached to the lower end of the spindle 93, the spindle 93 is moved downward by the ball screw 92 while the spindle 93 is rotated, and a wafer W placed on a chuck 95 is ground by the grinding stone 94.

PRIOR ART LITERATURE

Patent Literature

Patent Literature 1: Japanese Unexamined Patent Application Publication 2003-7661

SUMMARY OF THE INVENTION

Problem to be Solved by the Invention

However, in a planarizing device described in Patent Literature 1 as described above, when large normal force is generated during grinding processing, a cantilevered grinding stone is inclined as if raised up, i.e., spindle tilting occurs, and pyramid-shaped grinding marks or the like remain on the grinding surface of a wafer to damage the wafer.

More specifically, in a cantilever-type processing device in which a point where the grinding stone 94 is supported as shown in FIG. 9A is separated from a working point (processing point) to be processed, as shown in FIG. 10B, when one side of the grinding stone 94 rises up during grinding processing, the attitude of the grinding stone 94 cannot be kept in parallel with a wafer W. As a result, excessive force acts on a local part, as shown in FIG. 10, to make a position where a distal end of a grinding particle largely cuts into the wafer W, and cracks are disadvantageously formed.

Since two grinding stones are connected to each other through a grinding stone feeding mechanism, when the grinding stones vibrate during grinding processing, the two grinding stones resonate to amplify an amplitude, and processing accuracy may be deteriorated.

Thus, a technical problem to be solved, i.e., a technical problem in which coarse grinding and fine grinding for a wafer are continuously performed with a high grade occurs. An object of the present invention is to solve the problem.

Means for Solving the Problem

The present invention has been proposed to achieve the object, and an invention according to one embodiment provides a processing device which performs coarse-grinding processing and fine-grinding processing on a wafer including: an index table on which at least a coarse-grinding stage and a fine-grinding stage are disposed and which moves the wafer from the coarse-grinding stage to the fine-grinding stage; a column having a support column vertically formed on the outer periphery of the index table and a base part having an end supported by the support column and disposed to span over the coarse-grinding stage and the fine-grinding stage in a non-supporting state; a coarse-grinding means disposed on the column above the coarse-grinding stage and performing coarse-grinding processing on the wafer; and a fine-grinding means disposed on the column above the fine-grinding stage and performing fine-grinding processing on the wafer, and at least three first guides arranged on the outer periphery of the coarse-grinding means to sandwich a processing point of the coarse-grinding means and supporting the coarse-grinding means such that the coarse-grinding means can be slid in vertical directions with respect to the column.

According to the configuration, the column is disposed to span over the coarse-grinding stage and the fine-grinding stage of the index table, the coarse-grinding means is supported above the coarse-grinding stage, and the fine-grinding means is supported above the fine-grinding stage. More specifically, a point where the column supports the coarse-grinding means and the processing point of the coarse-grinding means are arranged to be close to each other, and a point where the column supports the fine-grinding means and the processing point of the fine-grinding means are arranged to be close to each other. In this manner, since spindle tilting of the coarse-grinding means and the fine-grinding means caused by normal force generated during the grinding processing is suppressed, grinding processing for the wafer can be performed with a high grade.

The wafer is kept by the same chuck in the coarse-grinding processing and the fine-grinding processing to make it possible to form the chuck keeping the wafer with high rigidity, and processing conditions such as a tilt angle of the wafer with respect to the grinding stone are unified for the coarse-grinding processing and the fine-grinding processing. For this reason, the throughput of grinding processing is improved. Furthermore, since the column has a diameter wider than that of the index table and can be formed with high rigidity, the coarse-grinding means and the fine-grinding means are suppressed from being resonated, and grinding processing can be performed on the wafer with a high grade. And, since the first guide supports the coarse-grinding means such that the coarse-grinding means can be slid in only the vertical directions to suppress spindle tilting of the coarse-grinding means caused by the normal force generated during grinding processing, grinding processing can be performed on the wafer with a high grade. In addition, since the first guide limits the directions of oscillation of the coarse-grinding means to only the vertical directions, an influence of vibration on the fine-grinding means disposed in parallel with the coarse-grinding means can be suppressed.

And an invention according to another embodiment provides a processing device which performs coarse-grinding processing and fine-grinding processing on a wafer, comprising: an index table on which at least a coarse-grinding stage and a fine-grinding stage are disposed and which moves the wafer from the coarse-grinding stage to the fine-grinding stage; a column having a support column vertically formed on the outer periphery of the index table and a base part having an end supported by the support column and disposed to span over the coarse-grinding stage and the fine-grinding stage in a non-supporting state; a coarse-grinding means disposed on the column above the coarse-grinding stage and performing coarse-grinding processing on the wafer; a fine-grinding means disposed on the column above the fine-grinding stage and performing fine-grinding processing on the wafer, and at least three second guides arranged on the outer periphery of the fine-grinding means to sandwich a processing point of the fine-grinding means and supporting the fine-grinding means such that the fine-grinding means can be slid in vertical directions with respect to the column. Therefore, since the second guides support the fine-grinding means such that the fine-grinding means can be slid in only the vertical directions to suppress spindle tilting of the fine-grinding means caused by normal force generated during grinding processing, grinding processing can be performed on the wafer with a high grade. In addition, since the second guides limit the directions of oscillation of the fine-grinding means to only the vertical directions, an influence of vibration on the coarse-grinding means disposed in parallel with the fine-grinding means can be suppressed.

An invention according to one embodiment provides a processing device including, in addition to the configuration of the present invention according to other embodiments, a first constant-pressure feeding mechanism arranged at a position vertically above the processing point of the coarse-grinding means, interposed between the coarse-grinding means and the column, and feeding the coarse-grinding means with a predetermined pressure.

With this configuration, in addition to the advantage of the invention according to several embodiments, when thrust force acting on the coarse-grinding means in coarse-grinding processing is excessive, since the first constant-pressure feeding mechanism temporarily moves the coarse-grinding means upward to grind the wafer in a ductility mode in a state in which the coarse-grinding means is floated, the wafer can be stably ground without being damaged.

An invention according to another embodiment provides a processing device including, in addition to the configuration of the invention according to other embodiments, a second constant-pressure feeding mechanism arranged at a position vertically above the processing point of the fine-grinding means, interposed between the fine-grinding means and the column, and feeding the fine-grinding means with a predetermined pressure.

According to the configuration, in addition to the advantage of the invention according to the other embodiments, when thrust force acting on the grinding stone is excessive such that the fine-grinding means tries to cut into the wafer at a depth larger than that of a predetermined grinding amount, the second constant-pressure feeding mechanism temporarily moves the fine-grinding means upward to grind the wafer in a ductility mode in a state in which the grinding stone of the fine-grinding means is floated. For this reason, the wafer can be stably ground without being damaged.

An invention according to another embodiment provides a processing device including, in addition to the configuration of the invention according to other embodiments, at least two second guides arranged on the outer periphery of the fine-grinding means to sandwich the processing point of the fine-grinding means and supporting the fine-grinding means such that the fine-grinding means can be slid in the vertical directions with respect to the column.

According to the configuration, in addition to the advantage of the invention according to prior embodiment, since the second guides support the fine-grinding means such that the fine-grinding means can be slid in only the vertical directions to suppress spindle tilting of the fine-grinding means caused by normal force generated during grinding processing, grinding processing can be performed on the wafer with a high grade. In addition, since the second guides limit the directions of oscillation of the fine-grinding means to only the vertical directions, an influence of vibration on the coarse-grinding means disposed in parallel with the fine-grinding means can be suppressed.

Effect of the Invention

According to the present invention, the column is disposed to span over the coarse-grinding stage and the fine-grading stage of the index table, the coarse-grinding means is supported on the column above the coarse-grinding stage and the fine-grinding stage is supported on the column above the fine-grinding stage to suppress spindle tilting of the coarse-grinding means and the fine-grinding means caused by normal force generated during grinding processing. For this reason, grinding processing can be performed on the wafer with a high grade. In addition, the wafer is kept on the same chuck in the coarse-grinding processing and the fine-grinding processing to make it possible to form the chuck keeping the wafer with high rigidity, and processing conditions such as a tilt angle of the wafer with respect to the grinding stone can be unified for the coarse-grinding processing and the fine-grinding processing. For this reason, a throughput of grinding processing is improved. Furthermore, since the column has a diameter larger than that of the index table and is formed with high rigidity, the coarse-grinding means and the fine-grinding means can be suppressed from being resonated, and grinding processing can be performed on the wafer with a high grade.

BRIEF DESCRIPTION OF THE DRAWINGS

FIGS. 9A and 9B are pattern diagrams showing a conventional processing device, in which FIG. 9A is a diagram showing a manner before grinding and FIG. 9B is a diagram showing a manner during grinding.

DETAILED DESCRIPTION OF EMBODIMENTS

A processing device according to the present invention is a processing device performing coarse-grinding processing and fine-grinding processing on a wafer to achieve the purpose of continuously performing coarse grinding and fine grinding for the wafer with a high grade, and the processing device is achieved by including: an index table on which at least a coarse-grinding stage and a fine-grinding stage are disposed and which moves the wafer from the coarse-grinding stage to the fine-grinding stage; a column having a support column vertically formed on the outer periphery of the index table and a base part having an end supported by the support column and disposed to span over the coarse-grinding stage and the fine-grinding stage in a non-supporting state; a coarse-grinding means disposed on the column above the coarse-grinding stage and performing coarse-grinding processing on the wafer; a fine-grinding means disposed on the column above the fine-grinding stage and performing fine-grinding processing on the wafer, and at least three first guides arranged on the outer periphery of the coarse-grinding means to sandwich a processing point of the coarse-grinding means and supporting the coarse-grinding means such that the coarse-grinding means can be slid in vertical directions with respect to the column.

Embodiments

A processing device 1 according to an embodiment of the present invention will be described below with reference to the accompanying drawings. In the following embodiment, when the number of constituent elements, numerical values, quantities, ranges, and the like are mentioned, except for a case especially clearly expressed or except that the number is limited to a specific number which is theoretically defined, the number should not be limited the specific number and may be equal to or larger or smaller than the specific number.

When the shapes of constituent elements or the like and positional relationships are mentioned, except for a case especially clearly expressed or except that it is supposed that the shapes and the positional relationships are not theoretically wrong, the shapes and the like substantially include shapes or the like approximate to or similar to the shapes.

The drawings may exaggerate by enlarging a characteristic part to simplify the characteristic feature, and the dimensional ratios or the like of constituent elements are not always equal to actual dimensional ratios. In the sectional views, in order to simplify the sectional structures of the constituent elements, hatching of some of the constituent elements may be omitted.

Figure 1:
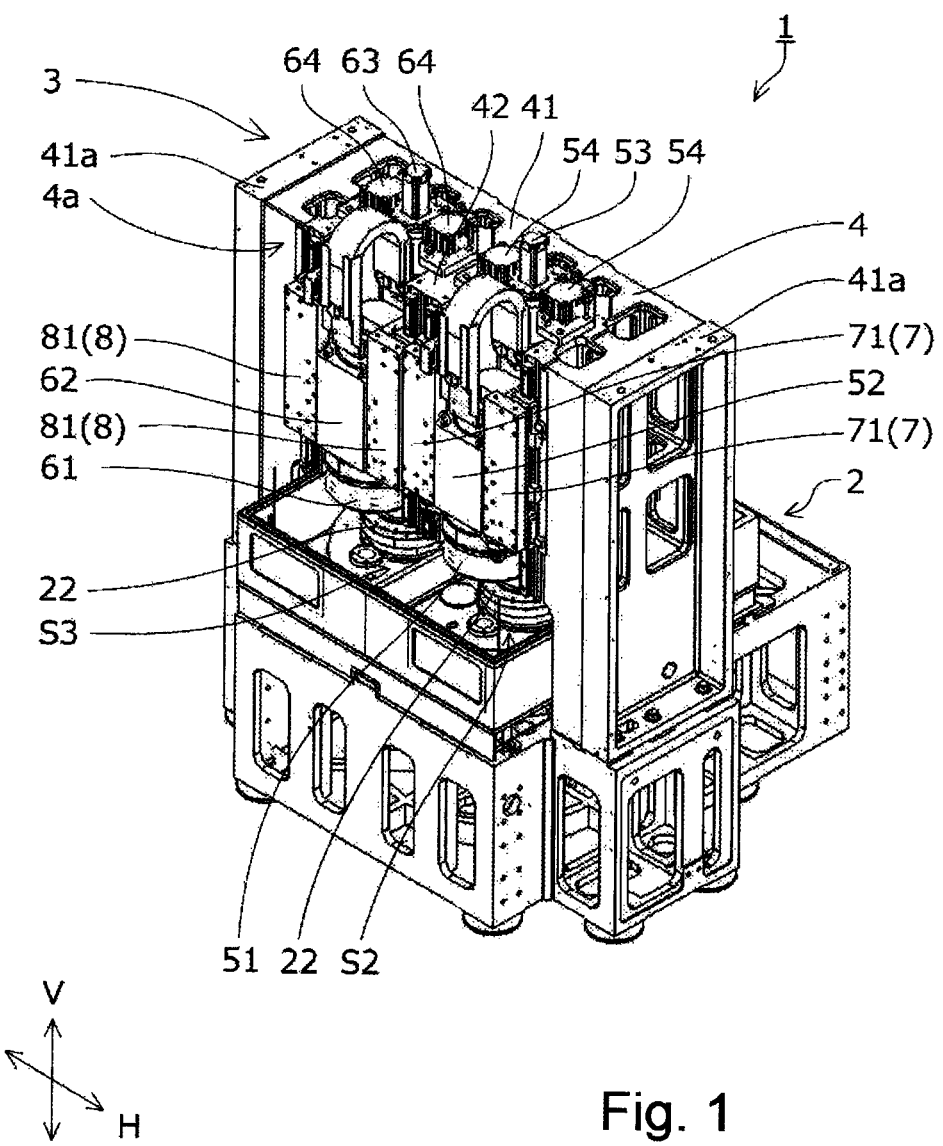
FIG. 1 is a perspective view showing a processing device according to an embodiment of the present invention.
Figure 2:
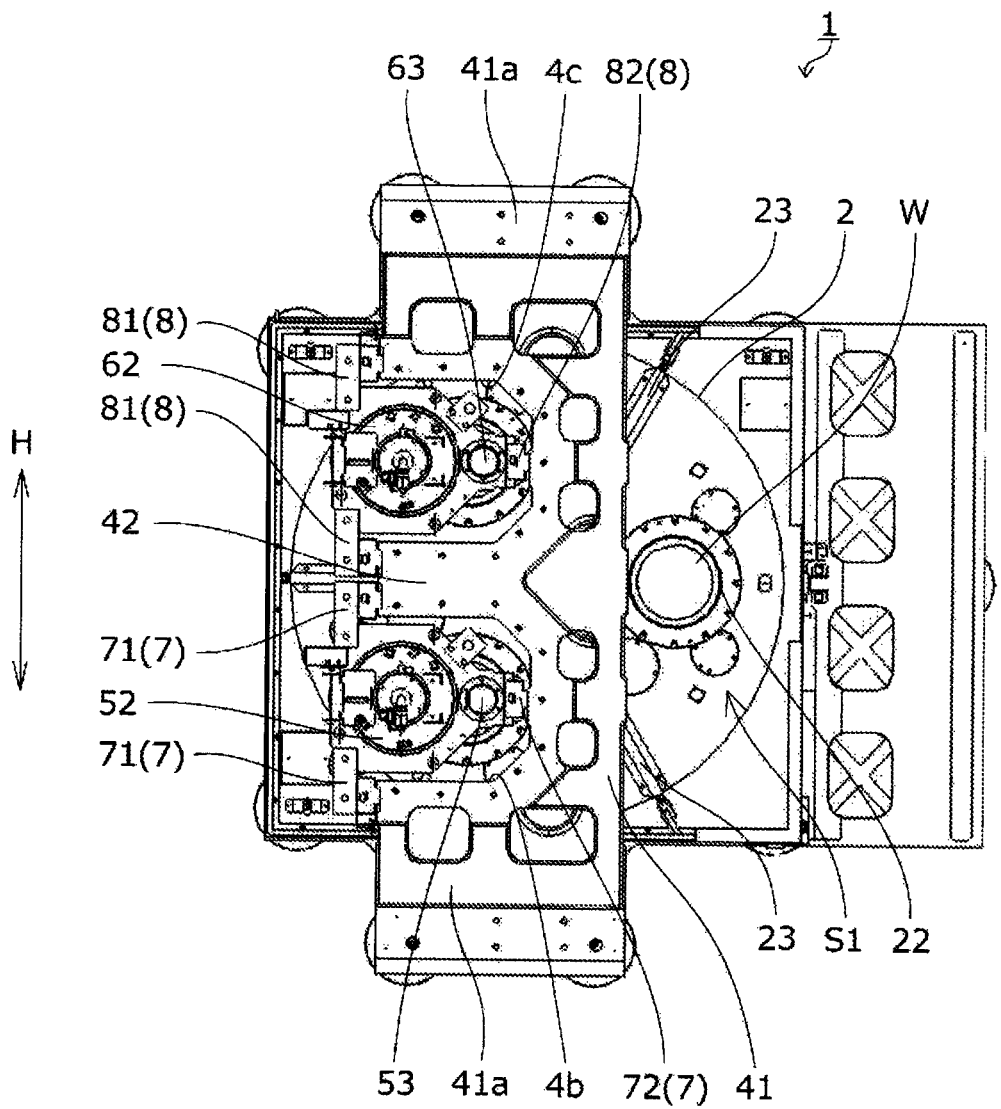
FIG. 2 is a plan view of the processing device shown in FIG. 1.
Figure 3:
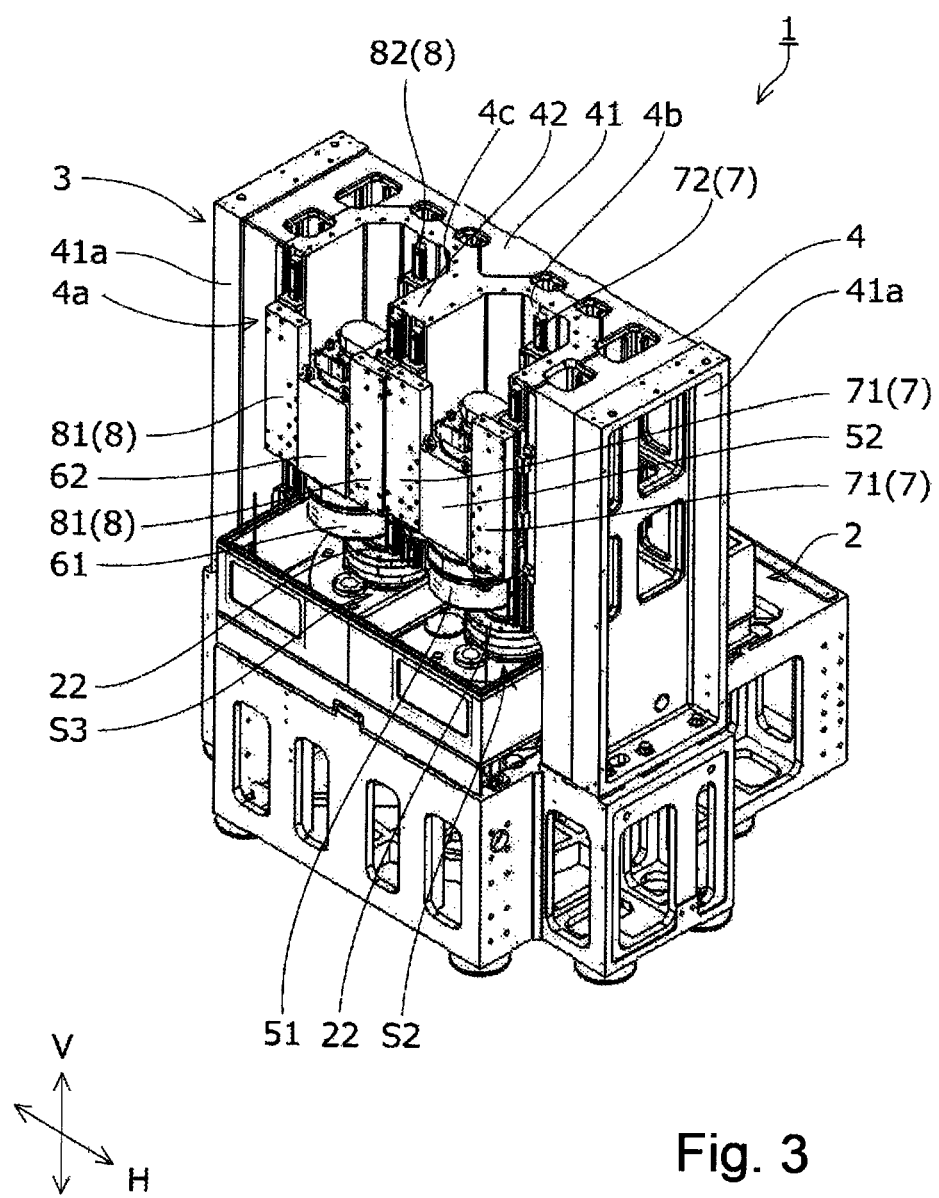
FIG. 3 is a perspective view of the processing device which is shown in FIG. 1 and partially omitted.
Figure 4:
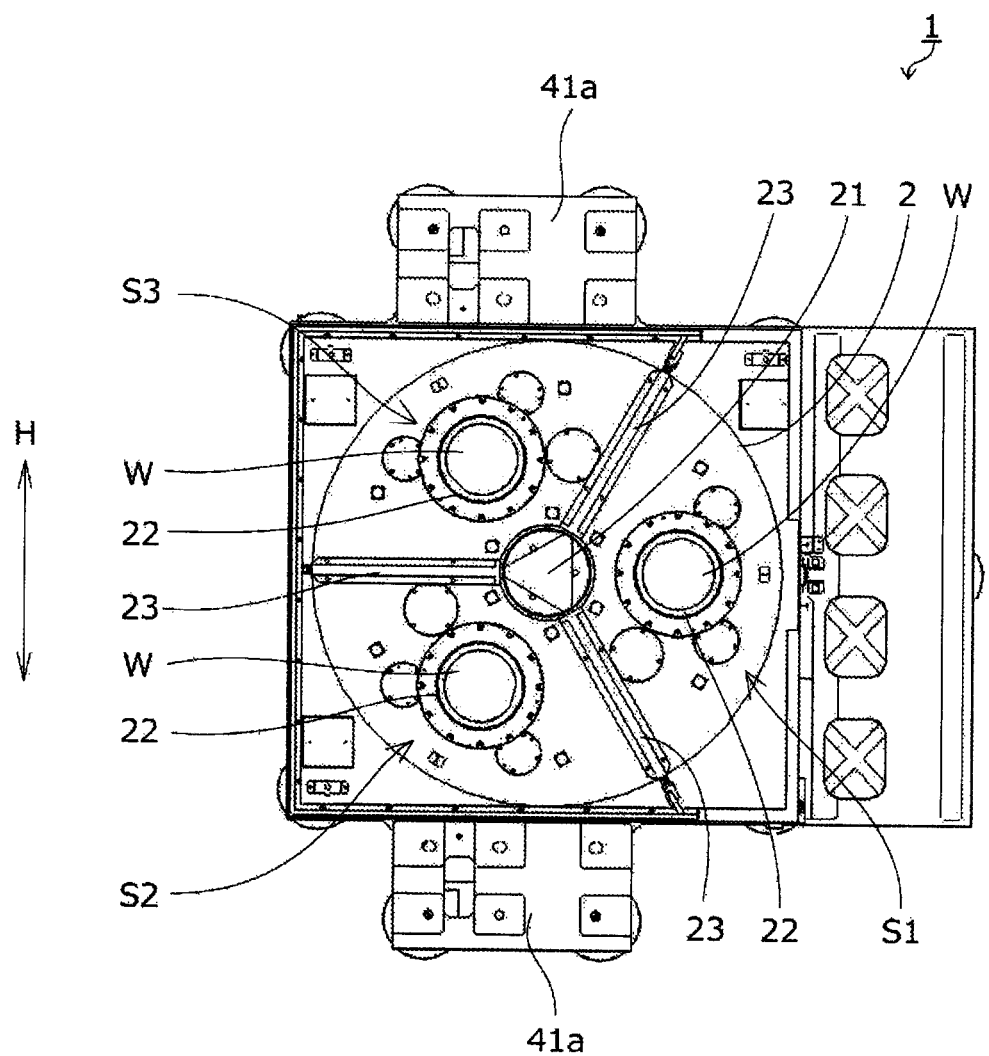
FIG. 4 is a plan view of the processing device shown in FIG. 3.

FIG. 1 is a perspective view showing a basic configuration of the processing device 1. FIG. 2 is a plan view of the processing device 1. FIG. 3 is a perspective view showing the processing device 1 in which a constant-pressure feeding mechanism is omitted. FIG. 4 is a plan view of the processing device 1 in which the constant-pressure feeding mechanism.

The processing device 1 continuously performs grinding processing on a wafer with two grinding stones arranged in parallel with each other. As a wafer W subjected to the grinding processing by using the processing device 1, a material such as a silicon wafer or a silicon carbide wafer having high hardness and high brittleness is preferably used. However, the wafer W is not limited to these materials. The processing device 1 includes an index table 2 and a main unit 3 arranged above the index table 2.

The index table 2 can rotate around a rotating shaft 21 connected to a motor (not shown). The index table 2 includes three chucks 22 arranged at intervals of 120 degrees on the circumference having the rotating shaft 21 as the center. The chucks 22 are connected to a vacuum source (not shown) adsorb the wafer W placed on the chucks 22 with a negative pressure. The chucks 22 are connected to a motor (not shown) and can be rotated. The index table 2 is partitioned into an alignment stage S1, a coarse-grinding stage S2, and a fine-grinding stage S3. Partition plates 23 are arranged between the chucks 22 to suppress processing liquid used on each of the stages from being scattered to an adjacent stage.

The alignment stage S1 is a stage which conveys the wafer W onto the chucks 22 by a conveying device or the like (not shown) and positions the wafer W to a predetermined position. The wafer W adsorbed and kept on the chucks 22 is fed to the coarse-grinding stage S2.

The coarse-grinding stage S2 is a stage on which the wafer W is subjected to coarse-grinding processing. The wafer W subjected to the coarse-grinding processing is fed to the fine-grinding stage S3.

The fine-grinding stage S3 is a stage on which the wafer W is subjected to fine-grinding processing. The wafer W subjected to the fine-grinding processing is fed to the alignment stage S1 and contained in a rack or the like (not shown) from the chucks 22 by a conveying device (not shown).

The main unit 3 includes an arch-like column 4 arranged to span over the index table 2, a coarse-grinding means 5 attached to the column 4 above the coarse-grinding stage S2, and a fine-grinding means 6 attached to the column 4 above the fine-grinding stage S3.

The coarse-grinding means 5 includes a coarse-grinding stone 51, a first spindle 52 having a lower end attached to the coarse-grinding stone 51, a first spindle feeding mechanism 53 moving the first spindle 52 upward or downward in vertical directions V. In the coarse-grinding means 5, a constant-pressure cylinder 54 serving as a first constant-pressure feeding mechanism is disposed.

The fine-grinding means 6 includes a fine-grinding stone 61, a second spindle 62 having a lower end attached to the fine-grinding stone 61, and a second spindle feeding mechanism 63 moving the second spindle 62 upward or downward in the vertical directions V. A constant-pressure cylinder 64 serving as a second constant-pressure feeding mechanism is disposed in the fine-grinding means 6.

In the processing device 1, a first guide 7 supporting the first spindle 52 such that the first spindle 52 can be slid in the vertical directions V and a second guide 8 supporting the second spindle 62 such that the second spindle 62 can be slid in the vertical directions V.

The operation of the processing device 1 is controlled by a control unit (not shown). The control unit controls each of the constituent elements constituting the processing device 1. The control unit is configured by, for example, a CPU, a memory, and the like. The functions of the control unit may be achieved such that control is performed by software, or may be achieved such that the control unit is operated by using hardware.

As described above, the processing device 1 continuously feeds the wafer W adsorbed and kept by the chuck 22 on the alignment stage S1 to the coarse-grinding stage S2 and the fine-grinding stage S3 in the order named while the wafer W is placed on the same chuck 22. The chuck adsorbing and keeping the wafer W can be formed with rigidity higher than that of a wafer keeping device such as a belt conveyor. In this manner, a throughput of grinding processing is improved, and grinding processing for the wafer W can be performed with a high grade.

The column 4 will be described below with reference to the drawings. The column 4 includes a base part 41 formed in a U-shape in a planar view and a central columnar part 42 projecting from the center of the base part 41, and is formed in an E-shape in a planar view.

The base part 41 is disposed to span over the coarse-grinding stage S2 and the fine-grinding stage S3. In this manner, when the wafer W is conveyed to the chuck 22 or conveyed out of the chuck 22, the conveying device or the like can access the chuck without interfering the column 4. Two support columns 41a vertically disposed on the outer periphery of the index table 2 are connected to the base part 41 to increase the rigidity of the base part 41.

The central columnar part 42 is disposed between the coarse-grinding stage S2 and the fine-grinding stage S3 in a planar view. The lower end of the central columnar part 42 is extended to above the index table 2. The central columnar part 42 may have a length enough to be able to dispose front guides 71 and 81 (will be described later).

Grooves 4b and 4c concavely formed in the vertical directions V in a front surface 4a of the column 4 in parallel with each other. The coarse-grinding means 5 is contained in the groove 4b. The fine-grinding means 6 is contained in the groove 4c.

Figure 5:
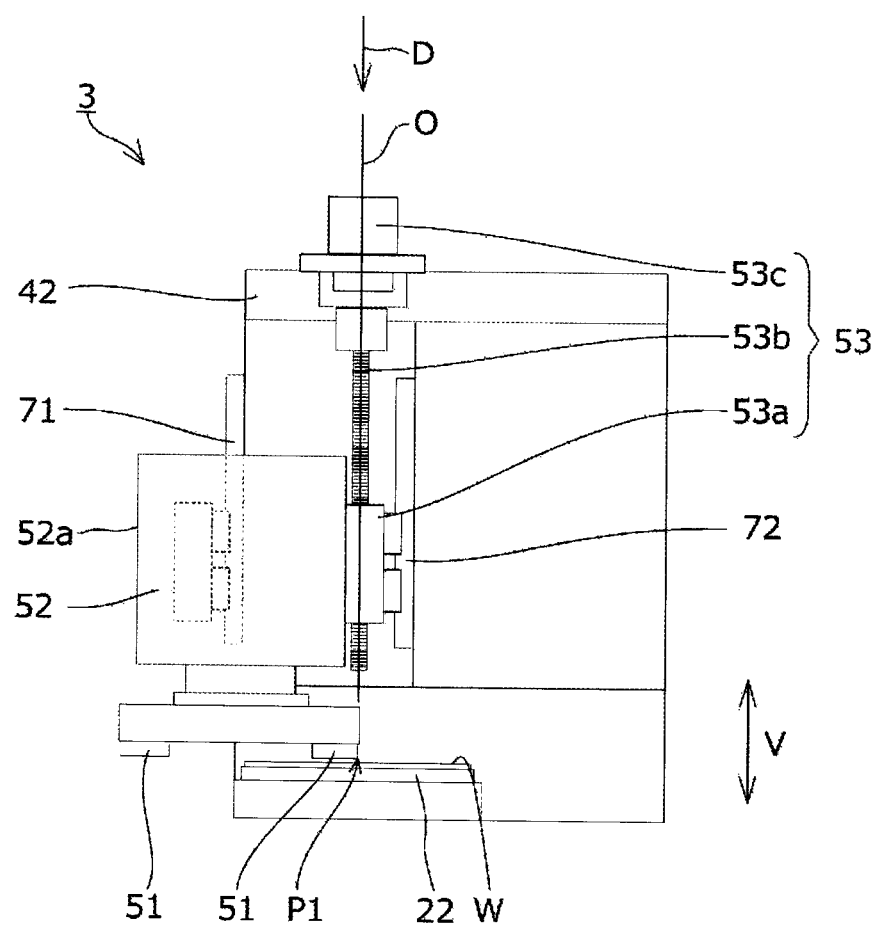
FIG. 5 is a side view typically showing a main unit.
Figure 6:
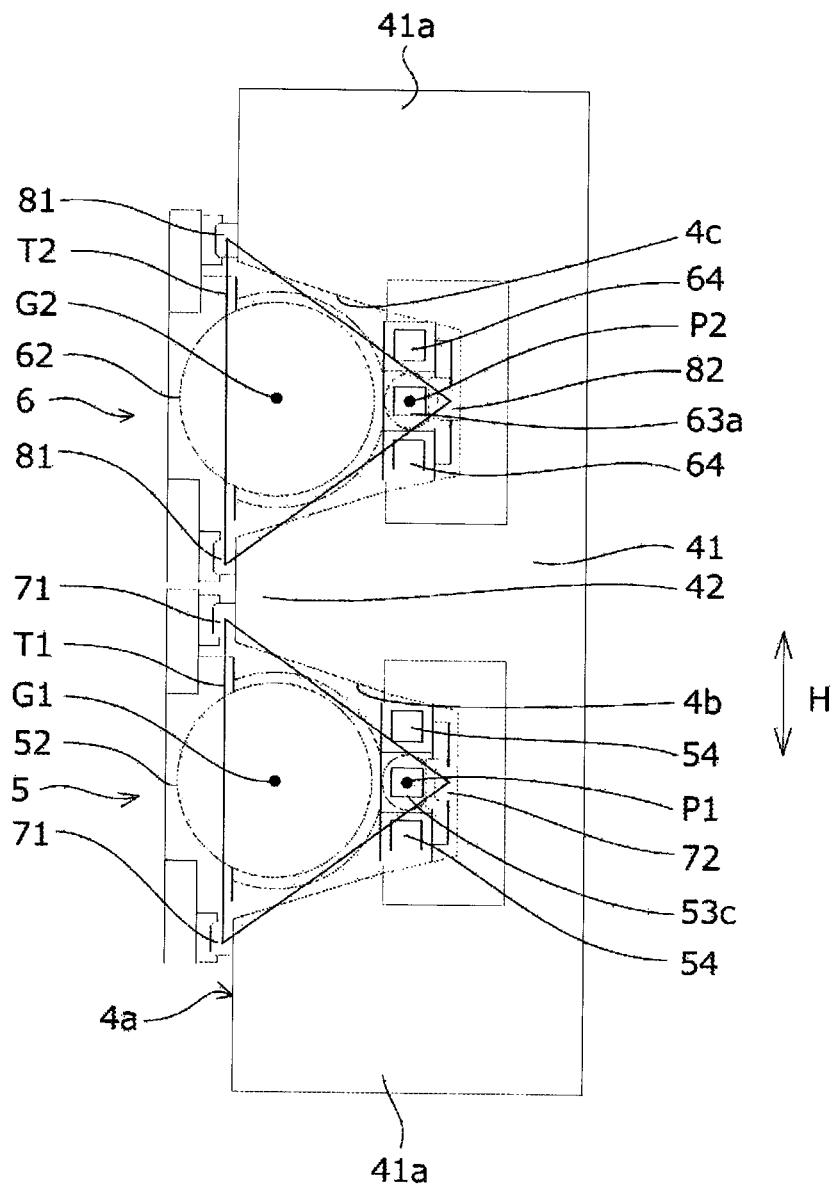
FIG. 6 is a plan view typically showing the main unit.
Figure 7:
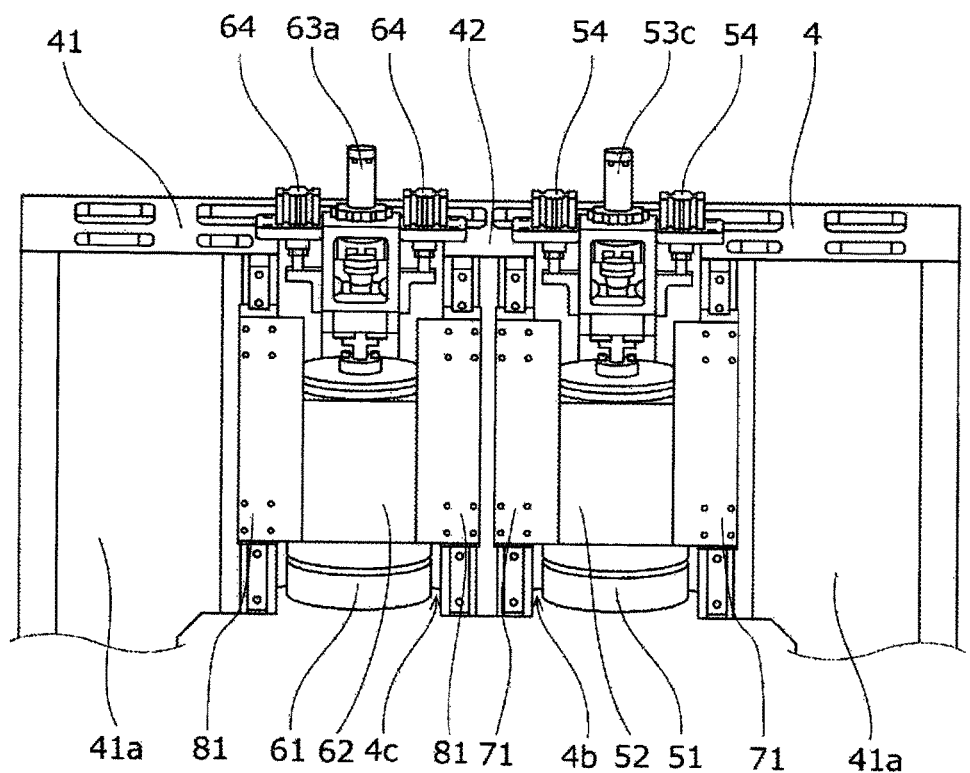
FIG. 7 is a perspective view showing an upper part of the main unit.
Figure 7:
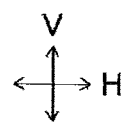
Figure 8:
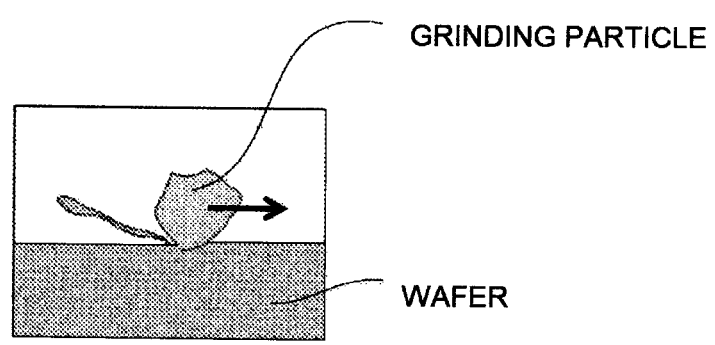
FIG. 8 is a pattern diagram showing a manner of ductility-mode grinding.
Figure 9A:
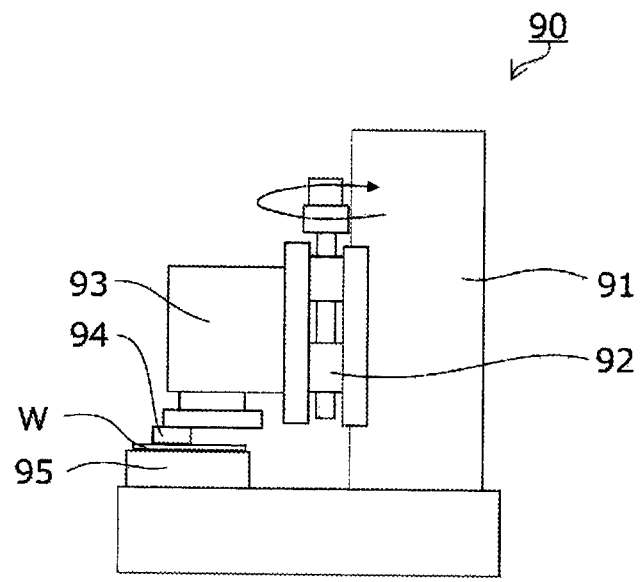
Figure 9B:
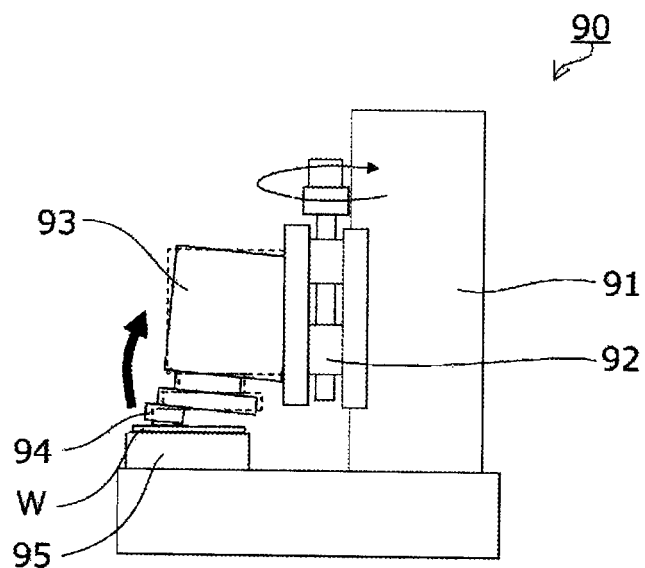
Figure 10:
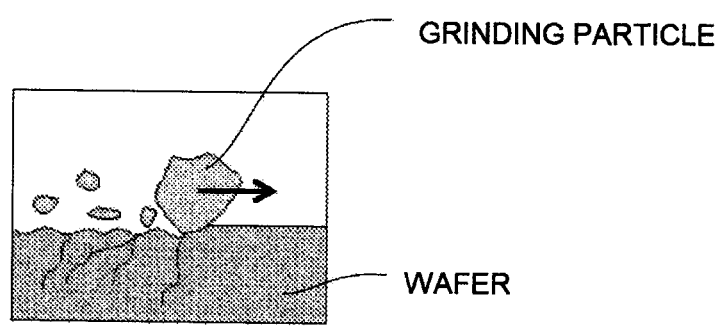
FIG. 10 is a pattern diagram showing a manner of brittle-mode grinding.

The coarse-grinding means 5 and the first guide 7 will be described below with reference to FIGS. 5 to 8. FIG. 5 is a side view of the main unit 3. FIG. 6 is a pan view of the main unit 3. FIG. 7 is a perspective view showing a perspective view showing an upper part of the main unit 3. FIG. 8 is a pattern diagram showing a manner of ductility-mode grinding.

The are stone 51 is configured such that a plurality of cup-shaped grinding stones are arranged at the lower end in the circumferential direction.

The first spindle 52 includes a saddle 52a having a lower end attached to the coarse-grinding stone 51 and a motor (not shown) disposed in the saddle 52a to rotate the coarse-grinding stone 51.

The first spindle feeding mechanism 53 includes a nut 53a connecting the saddle 52a and a rear guide 72 (will be described later) to each other, a ball screw 53b moving the nut 53a upward or downward, and a motor 53c rotating the ball screw 53b.

The motor 53c is driven to rotate the ball screw 53b forward, and the nut 53a moves downward in a feeding direction D of the ball screw 53b parallel in the vertical directions V, so that the saddle 53a moves downward. As shown in FIG. 5, the feeding direction D passes through a processing point P1 at which the coarse-grinding stone 51 processes the wafer W and is on a straight line parallel in the vertical directions V. In other words, a rotating axis O of the ball screw 53b and the processing point P1 of the coarse-grinding stone 51 are arranged on the same straight line in the vertical directions V.

In the main unit 3, an in-process gauge (not shown) measuring the thickness of the wafer W is disposed. When the thickness of the wafer W measured by the in-process gauge reaches a predetermined value, the motor 53c is driven to rotate the ball screw 53b backward, and the saddle 52a connected to the nut 53a moves upward, so that the wafer W and the coarse-grinding stone 51 are separated from each other.

As shown in FIGS. 6 and 7, the constant-pressure cylinders 54 are disposed on both sides of the nut 53a of the first spindle feeding mechanism 53 in horizontal directions H, respectively. Each of the constant-pressure cylinders 54 includes the first spindle 52 and the first spindle feeding mechanism 53 such that the first spindle 52 and the first spindle feeding mechanism 53 are suspended in the groove 4b. More specifically, the lower end of the piston rod of the constant-pressure cylinder 54 is connected to the nut 53a. Since the constant-pressure cylinders 54 are disposed on both the sides of the first spindle feeding mechanism 53 in the horizontal directions H, when the first spindle feeding mechanism 53 moves upward, the first spindle feeding mechanism 53 is suppressed from being tilted in the horizontal directions H.

The constant-pressure cylinder 54 is an air-cylinder which employs a known mechanism configured by a cylinder, a piston, a piston rod, a compressor, and the like. The constant-pressure cylinder 54, when thrust force acting on the coarse-grinding stone 51 in grinding processing is transmitted to the piston rod, moves the piston upward such that compressed air filled in the cylinder of the constant-pressure cylinder 54 is thrust back. A drive pressure of the constant-pressure cylinder 54 is set to a value equal to or smaller than a value corresponding to thrust force acting on the coarse-grinding stone 51 when the coarse-grinding stone 51 cuts into the wafer W by a critical cut-in depth (Dc value) of the wafer W. The Dc value varies depending on the materials of the wafers W. For example, the Dc value is 0.09 μm when the wafer is a silicon wafer, and 0.15 μm when the wafer is a carbide wafer.

When the coarse-grinding stone 51 tries to cut into the wafer in a depth larger than that given by a predetermined grinding amount (for example, Dc value) to make the thrust force acting on the coarse-grinding stone 51 excessive, the first spindle 52 and the first spindle feeding mechanism 53 temporarily move upward. For this reason, the coarse-grinding stone 51 is suppressed from cutting into the wafer W in a depth equal to or larger than that given by the Dc value.

The first guide 7 is configured by front guides 71 arranged on the front surfaces of the base part 41 and the central columnar part 42 one by one and one rear guide 72 arranged in the groove 4b. The front guide 71 and the rear guide 72 are, for example, linear guides. The saddle 52a is directly attached to the front guides 71. The saddle 52a is also attached to the rear guide 72 through the nut 54a.

The front guides 71 and the rear guide 72 are disposed in parallel with each other along the vertical directions V. In this manner, the front guides 71 and the rear guide 72 regulate the saddle 52a such that the 52a moves along the vertical directions V. The front guides 71 and the rear guide 72 are arranged to sandwich the processing point P1 of the coarse-grinding stone 51.

In the first guide 7, as shown in FIG. 6, in a planar view, a gravity point G1 of the first spindle 52 is arranged in a triangle T1 formed by the front guide 71 and the rear guides 72. More specifically, as the first guide 7, an arbitrary guide may be used as long as spindle tilting of the first spindle 52 can be suppressed. For example, as the first guide 71, a guide in which two linear guides are disposed and the gravity point G1 is arranged on a straight line connecting the linear guides in a planar view may be used.

As described above, when the processing point P1 of the coarse-grinding stone 51 is arranged on the rotating axis O of the ball screw 53b to make thrust force acting on the coarse-grinding stone 51 excessive, the first spindle 52 and the first spindle feeding mechanism 53 escape in the vertical directions V. In addition, the gravity point G1 of the first spindle 52 is arranged in the triangle T1 formed by the front guides 71 and the rear guide 72 to suppress spindle tilting of the coarse-grinding means 5. Furthermore, when thrust force acting on the coarse-grinding stone 51 is excessive, the constant-pressure cylinder 54 temporarily moves the first spindle 52 and the first spindle feeding mechanism 53 upward, and coarse-grinding processing is performed with a predetermined pressure by the weight of the coarse-grinding means 5. For this reason, as shown in FIG. 8, the wafer W can be ground in a ductility mode while the grinding particles of the coarse-grinding stone 51 are not in excessive contact with the wafer W, i.e., while the coarse-grinding stone 51 is floated.

The fine-grinding means 6 and the second guide 8 will be described below with reference to FIGS. 6 and 7. Since the basic configuration of the fine-grinding means 6 corresponds to the basic configuration of the coarse-grinding means 5, an overlapping description will be omitted.

The fine-grinding stone 61 is configured such that a plurality of cup-type grinding stones are arranged at the lower end in the circumferential direction.

The second spindle 62 includes a saddle 62 having a lower end attached to the fine-grinding stone 61 and a motor (not shown) disposed in the saddle 62a and rotating the fine-grinding stone 61.

The second spindle feeding mechanism 63 has the same configuration as that of the first spindle feeding mechanism 53, and includes a nut (not shown) connecting the saddle 62a and the rear guide 82 to each other, a ball screw (not shown) moving the nut upward or downward, and a motor 63a rotating the ball screw. A rotating axis of the ball screw and a processing point P2 of the fine-grinding stone 61 are arranged on the same straight line in the vertical directions V. Driving of the motor 63a is controlled on the basis of a film thickness measured by the in-process gauge.

The constant-pressure cylinders 64 are disposed on both the sides of the second spindle feeding mechanism 63 in the horizontal directions H, respectively, and are interposed between the column 4 and the nut. The constant-pressure cylinder 64 has respectively. Each of the constant-pressure cylinders 64 includes the second spindle 62 and the second spindle feeding mechanism 63 such that the second spindle 62 and the second spindle feeding mechanism 63 are suspended in the groove 4c. When the fine-grinding stone 61 tries to cut into the wafer in a depth larger than that given by the Dc value to make thrust force acting on the fine-grinding stone 61 excessive, the constant-pressure cylinder 64 temporarily moves the second spindle 62 and the second spindle feeding mechanism 63 upward, the fine-grinding stone 61 is suppressed from cutting into the wafer in a depth equal to or larger than that given by the Dc value.

The second guide 8 includes front guides 81 arranged on the front surfaces of the base part 41 and the central columnar part 42, respectively, and one rear guide 82 arranged in the groove 4b. The front guides 81 and the rear guide 82 are, for example, linear guides. The saddle 62a is directly attached to the front guide 81. The saddle 62a is attached to the rear guide 82 through the second spindle feeding mechanism 63.

The front guides 81 and the rear guide 82 are disposed in parallel with each other along the vertical directions V. In this manner, the front guides 81 and the rear guide 82 regulate the saddle 62a such that the saddle 62a moves along the vertical directions V. The front guides 81 and the rear guide 82 are arranged to sandwich the processing point P2 of the fine-grinding stone 61.

In the second guide 8, in a planar view, the second spindle 62 is arranged in a triangle T2 formed by the front guides 81 and the rear guide 82. More specifically, a gravity point G2 of the second spindle 62 is arranged in the triangle T2 formed by the front guides 81 and the rear guide 82. In this manner, the front guides 81 and the rear guide 82 arranged around the second spindle 62 suppress spindle tilting of the second spindle 62. As the second guide 8, an arbitrary guide which can suppress the spindle tilting of the second spindle 62 may be used. For example, as the guide, two linear guides may be disposed, and the gravity point G2 may be arranged on a straight line connecting the linear guides in a planar view.

As described above, when the processing point P2 of the fine-grinding stone 61 is arranged on the rotating axis of the ball screw of the second spindle feeding mechanism 63 to make thrust force acting on the fine-grinding stone 61 excessive, the second spindle 62 and the second spindle feeding mechanism 63 are designed to escape in the vertical directions V. In addition, the gravity point G2 of the second spindle 62 is arranged in the triangle T2 formed by the front guides 81 and the rear guide 82 to suppress spindle tilting of the fine-grinding means 6. Furthermore, when the thrust force acting on the fine-grinding stone 61 is excessive, the constant-pressure cylinder 64 temporarily moves the second spindle 62 and the second spindle feeding mechanism 63 upward, and coarse-grinding processing is performed with a predetermined pressure by the weight of the coarse-grinding means 5. For this reason, as shown in FIG. 8, the wafer W can be ground in a ductility mode while the grinding particles of the fine-grinding stone 61 are not in excessive contact with the wafer W, i.e., while the coarse-grinding stone 61 is floated.

Examples of concrete processing conditions set when an SiC substrate is ground in a ductility mode using the processing device 1 described above will be described below.

When, as processing conditions of coarse-grinding processing, the coarse-grinding stone 51 having a grain size of #400 and a grade M was prepared, the rotating speed of the first spindle 52 was set to 2000 rpm, the rotating speed of the chuck 32 was set to 301 rpm, the drive pressure of the constant-pressure cylinder 55 was set to 0.4 MPa, the feeding speed of the first spindle feeding mechanism 53 was set to 1 μm/s, and a grounding amount (thickness) was set to 40 μm. At this time, an arithmetic average roughness was 34.5 nm.

As the processing conditions of fine-grinding processing, a fine-grinding stone 61 having a grain size of #3000 and a grade J was prepared, the rotating speed of the second spindle 62 was set to 2000 rpm, the rotating speed of the chuck 32 was set to 301 rpm, the drive pressure of the constant-pressure cylinder 65 was set to 0.8 MPa, and the feeding speed of the second spindle feeding mechanism 63 was set to to 0.4 μm/s, and a grounding amount (thickness) was set to 10 μm. At this time, an arithmetic average roughness was 6.9 nm.

In this manner, in the processing device 1, the column 4 is disposed to span over the coarse-grinding stage S2 and the fine-grinding stage S3 of the index table 2, the coarse-grinding means 5 is supported by the front guide 71 and the rear guide 72, and the fine-grinding means 6 is supported by the front guide 81 and the rear guide 82. More specifically, a point at which the column 4 supports the coarse-grinding means 5 and the processing point P1 of the coarse-grinding means 5 are arranged to be close to each other, and a point at which the column 4 supports the fine-grinding means 6 and the processing point P2 of the fine-grinding means 6 are arranged to be close to each other. In this manner, since spindle tilting of the coarse-grinding means 5 and the fine-grinding means 6 caused by normal force during grinding processing is suppressed, grinding processing of the wafer W can be performed with a high grade.

The wafer W is kept by the same chuck 22 in coarse-grinding processing and fine-grinding processing to make it possible to form the chuck 22 keeping the wafer W with high rigidity, and processing conditions such as tilt angles of the wafer W with respect to the coarse-grinding stone 51 and the fine-grinding stone 61 are unified. For this reason, a throughput of grinding processing is improved. Furthermore, since the column 4 can be formed with high rigidity, the coarse-grinding means 5 and the fine-grinding means 6 can be suppressed from being resonated, and grinding processing for the wafer W can be performed with a high grade.

Furthermore, the drive pressures of the constant-pressure cylinders 54 and 64 are adjusted to make vibration cycles of the coarse-grinding means 5 and the fine-grinding means 6 different from each other, the coarse-grinding means 5 and the fine-grinding means 6 can be further suppressed from being resonated.

The concrete configuration of the constant-pressure feeding mechanism is not limited to the configuration described above, and any configuration in which the spindle can be moved upward to escape excessive thrust force acting on a grinding stone may be used.

The various changes and modifications of the present invention can be effected without departing from the spirit and scope of the present invention, and the present invention includes the changes and modifications, as a matter of course.

REFERENCE NUMERALS

1 . . . processing device
2 . . . index table
21 . . . rotating axis
22 . . . chuck
23 . . . partition plate
3 . . . main unit
4 . . . column
4a . . . front surface
4b . . . (containing coarse-grinding means) groove
4c . . . (containing fine-grinding means) groove
41 . . . base part
41a . . . support column
42 . . . central columnar part
5 . . . coarse-grinding means
51 . . . coarse-grinding stone
52 . . . first spindle
53 . . . first spindle feeding mechanism
53a . . . nut
53b . . . ball screw
53c . . . motor
54 . . . constant-pressure cylinder (first constant-pressure feeding mechanism)
6 . . . fine-grinding means
61 . . . fine-grinding stone
62 . . . second spindle
63 . . . second spindle feeding mechanism
63a . . . motor
64 . . . constant-pressure cylinder (second constant-pressure feeding mechanism)
7 . . . first guide
71 . . . front guide
72 . . . rear guide
8 . . . second guide
81 . . . front guide
82 . . . rear guide
H . . . horizontal directions
G1 . . . gravity point (of first spindle)
G2 . . . gravity point (of second spindle)
O . . . rotating axis of ball screw
P1 . . . processing point (of coarse-grinding stone)
P2 . . . processing point (of fine-grinding stone)
S1 . . . alignment stage
S2 . . . coarse-grinding stage
S3 . . . fine-grinding stage
T1 . . . triangle formed by first guides
T2 . . . triangle formed by second guide
V . . . vertical directions
W . . . wafer

What is claimed is:

1. A processing device which performs coarse-grinding processing and fine-grinding processing on a wafer, comprising:
   an index table on which at least a coarse-grinding stage and a fine-grinding stage are disposed and which moves the wafer from the coarse-grinding stage to the fine-grinding stage;
   a column having a support column vertically formed on the outer periphery of the index table and a base part having an end supported by the support column and disposed to span over the coarse-grinding stage and the fine-grinding stage in a non-supporting state;
   a coarse-grinding means disposed on the column above the coarse-grinding stage and performing coarse-grinding processing on the wafer;
   a fine-grinding means disposed on the column above the fine-grinding stage and performing fine-grinding processing on the wafer, and
   at least three first guides arranged on the outer periphery of the coarse-grinding means to sandwich a processing point of the coarse-grinding means and supporting the coarse-grinding means such that the coarse-grinding means can be slid in vertical directions with respect to the column.

2. The processing device according to claim 1, further comprising:
   a first constant-pressure feeding mechanism arranged at a position vertically above the processing point of the coarse-grinding means, interposed between the coarse-grinding means and the column, and feeding the coarse-grinding means with a predetermined pressure.

3. The processing device according to claim 1, further comprising:
   a second constant-pressure feeding mechanism arranged at a position vertically above the processing point of the fine-grinding means, interposed between the fine-grinding means and the column, and feeding the fine-grinding means with a predetermined pressure.

4. The processing device according to claim 1, further comprising:
   at least two second guides arranged on the outer periphery of the fine-grinding means to sandwich a processing point of the fine-grinding means and supporting the fine-grinding means such that the fine-grinding means can be slid in the vertical directions with respect to the column.

5. A processing device which performs coarse-grinding processing and fine-grinding processing on a wafer, comprising:
   an index table on which at least a coarse-grinding stage and a fine-grinding stage are disposed and which moves the wafer from the coarse-grinding stage to the fine-grinding stage;
   a column having a support column vertically formed on the outer periphery of the index table and a base part having an end supported by the support column and disposed to span over the coarse-grinding stage and the fine-grinding stage in a non-supporting state;
   a coarse-grinding means disposed on the column above the coarse-grinding stage and performing coarse-grinding processing on the wafer;
   a fine-grinding means disposed on the column above the fine-grinding stage and performing fine-grinding processing on the wafer, and
   at least three second guides arranged on the outer periphery of the fine-grinding means to sandwich a processing point of the fine-grinding means and supporting the fine-grinding means such that the fine-grinding means can be slid in vertical directions with respect to the column.

6. The processing device according to claim 5, further comprising:
   a first constant-pressure feeding mechanism arranged at a position vertically above the processing point of the coarse-grinding means, interposed between the coarse-grinding means and the column, and feeding the coarse-grinding means with a predetermined pressure.

7. The processing device according to claim 5, further comprising:
   a second constant-pressure feeding mechanism arranged at a position vertically above the processing point of the fine-grinding means, interposed between the fine-grinding means and the column, and feeding the fine-grinding means with a predetermined pressure.

8. The processing device according to claim 2, further comprising:
   a second constant-pressure feeding mechanism arranged at a position vertically above the processing point of the fine-grinding means, interposed between the fine-grinding means and the column, and feeding the fine-grinding means with a predetermined pressure.

* * * * *